US006266689B1

(12) United States Patent
Shier et al.

(10) Patent No.: US 6,266,689 B1
(45) Date of Patent: Jul. 24, 2001

(54) COMPLEX SWITCHED CAPACITOR FILTER AND DESIGNING METHOD FOR SUCH A FILTER

(75) Inventors: Thorsten Shier, Sundyberg; Svante Signell, Vällingby, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/105,200

(22) Filed: Jun. 26, 1998

(30) Foreign Application Priority Data

Jun. 27, 1997 (SE) .................................................. 9702492

(51) Int. Cl.⁷ ..................................................... G06G 7/02
(52) U.S. Cl. ................................................................ 708/819
(58) Field of Search .............................................. 708/819

(56) References Cited

U.S. PATENT DOCUMENTS

| | | |
|---|---|---|
| 4,210,872 | 7/1980 | Gregorian . |
| 4,458,216 * | 7/1984 | Bingham ............................. 332/151 |
| 4,543,546 * | 9/1985 | Hariharan ............................. 333/173 |
| 4,924,189 | 5/1990 | Senn et al. . |
| 6,026,129 * | 2/2000 | Ohta et al. ........................... 375/332 |

OTHER PUBLICATIONS

Franca, "Efficient Switched–Capacitor Implentation of Linear Phase FIR Decimators", Electronics Letters Sep. 28th 1989, vol. 25 No. 20, pp. 1402–1403.*

Hurst et al, "Finite Impulse Response Switched–Capacitor Decimation Filters for the DSM D/A Interface", 1989 IEEE.*

Iwakura, Hiroshi, et al., "Design of Complex Digital Filters Using Frequency Transformation," IEICE Transactions, vol. E 74, No. 12, pp. 3930–3934 (1991).

Liu, Q. et al., "Switched Capacitor Implementation of Complex Filters", IEEE International Symposium on Circuits and Systems, vol. 3, 19. pp. 1121–1124, 1986.

Jantzi, S. et al. "A Quadrature Bandpass Σ Δ Modulator for Digital Radio", IEEE International Solid–State Circuits Conference, vol. 40, pp. 216, 217, 460, Feb. 1997.

Smolka, G., "Switched–Capacitor Bandpass Filter Bandpassed on Simulation of Canonical Reactance Sections", IEEE Journal of Solid–State Circuits, vol. sc–19, No. 3, pp. 360–367, Jun. 1984.

Zzerev, Antol, "The Catalog of Normalized Lowpass Filters", Handbook of Filter Synthesis.

Signell, Svante, "Design of Parasitics–Insensitive bilinear Switched–Capacitor Filters a Matrix Conversion Method", Dec. 1981.

* cited by examiner

Primary Examiner—Tan V. Mai
(74) Attorney, Agent, or Firm—Burns, Doane, Swecker & Mathis, L.L.P.

(57) ABSTRACT

A complex switched capacitor filter is formed by selecting an analog baseband prototype filter with the desired filter characteristics. This prototype is converted into a corresponding real switched capacitor filter, and finally the real switched capacitor filter is converted into a complex switched capacitor filter by replacing each element of real filter by a frequency shifted complex counterpart.

5 Claims, 6 Drawing Sheets

| ELEMENT | TRANSFER FUNCTION | SYMBOL |
|---|---|---|
| NON-INVERTING BOTTOM PLATE | $B$ | |
| INVERTING BOTTOM PLATE | $-Iz^{-1}$ | |
| TOGGLE | $Tz^{-1}$ | |
| FIXED CAPACITOR | $C(1-z^{-1})$ | |

COMPLEX SWITCHED CAPACITOR FILTER AND DESIGNING METHOD FOR SUCH A FILTER

The present invention relates to a complex switched capacitor filter and a designing method for such a filter.

BACKGROUND

Real switched capacitor filters are well known citation [1] and have the advantage that they can be integrated, can handle analog input signals, are small in size and have low power dissipation. Recently there has been more and more interest in complex filters, i. e. filters having two inputs and two outputs for receiving a complex input signal and delivering a filtered complex output signal. One example of such filters is complex bandpass filters, which are useful in, for example, radio communication applications. Thus, it would be desirable to be able to design a filter for the complex domain having all the advantages of a real switched capacitor filter.

SUMMARY

An object of the present invention is to provide an extension of a switched capacitor filter into the complex domain while maintaining all the advantages of the corresponding real filter and a method to design such a filter.

This object is achieved with a filter and designing method.

Briefly, the present invention forms a complex switched capacitor filter by starting with an analog baseband prototype filter having the required filter specifications. This prototype filter is transformed into a corresponding real switched capacitor filter. Finally the real filter is transformed into a complex filter, preferably by frequency shifting, to obtain the complex switched capacitor filter.

BRIEF DESCRIPTION OF THE DRAWINGS

The invention, together with further objects and advantages thereof, may best be understood by making reference to the following description taken together with the accompanying drawings, in which.

DETAILED DESCRIPTION OF THE PREFERRED EMBODIMENTS

The following description will illustrate the present invention with reference to the design of a complex switched capacitor bandpass filter. Starting point will be a third order analog elliptic lowpass filter. However, it is appreciated that this example only serves to illustrate the invention. Other complex switched capacitor filters, such as bandstop filters may be designed in a similar way by using other analog baseband prototype filters as starting point. Furthermore, other types of analog filters, such as Butterworth, or Bessel filters may be used as prototype filters. The prototype filters may also be of arbitrary order.

Figure 1:
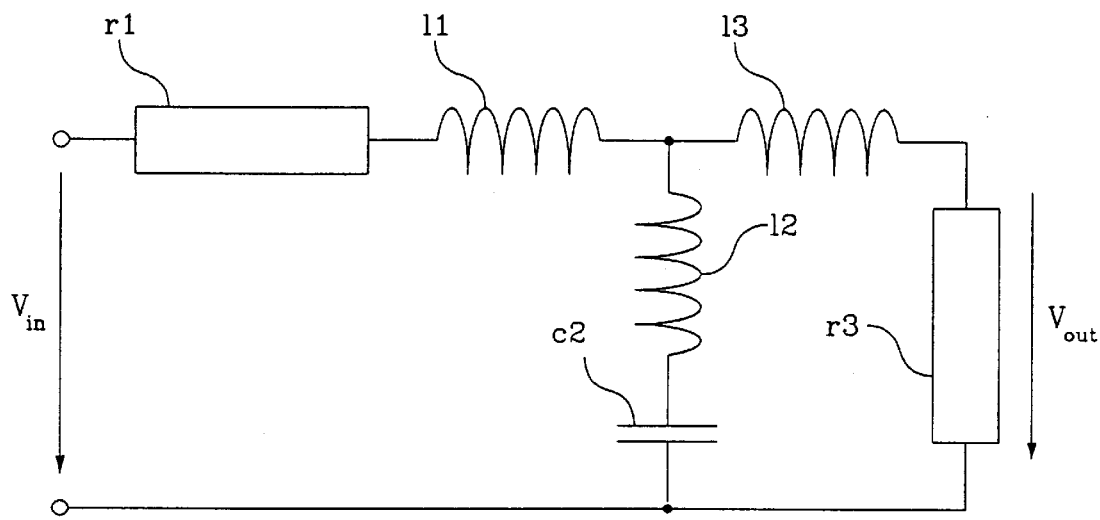
FIG. 1 is a block diagram of a third order elliptic lowpass filter.

FIG. 1 illustrates a third order analog elliptic lowpass filter. In this example the filter has the following characteristics:

stopband attenuation=40.23 dB reflection coefficient ρ=20% cut-off frequency=1 radian/s

With these characteristics the corresponding element values may be looked up in a filter table, for example [2] (in the figures indices have not been lowered)

$r_1 = r_3 = 1$ $l_1 = l_3 = 1.1395$ $l_2 = 0.0669$ $c_2 = 1.0844$

The first step in the design of a complex switched capacitor filter is to transform this analog prototype filter into a corresponding real switched capacitor filter. This transformation is described in, for example citation [1].

Figure 2:
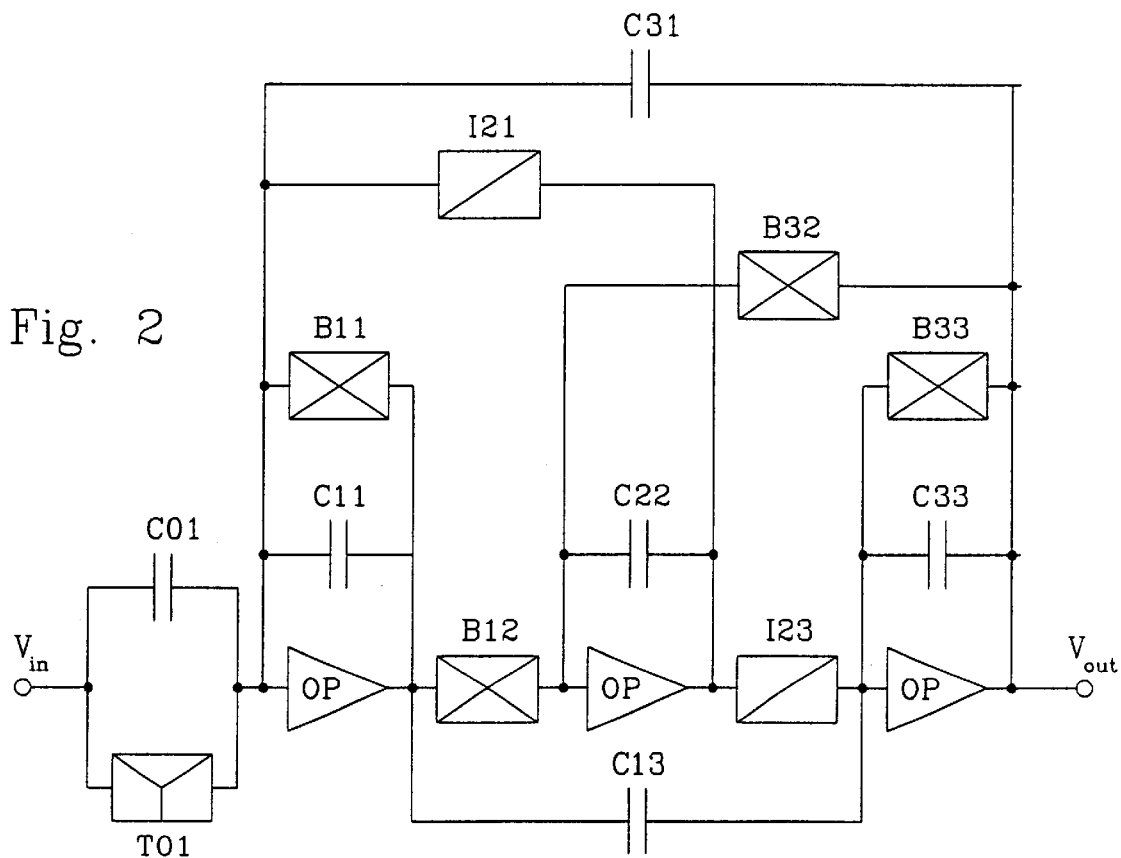
FIG. 2 is a block diagram of a switched capacitor filter that corresponds to the filter in FIG. 1.

FIG. 2 illustrates the corresponding switched capacitor lowpass filter. A real switched capacitor filter comprises, apart from operational amplifiers OP, four basic elements, namely a non-inverting bottom plate B, an inverting bottom plate I, a toggle T and a fixed capacitor C. These elements, their transfer functions and symbols are summarized in the table in FIG. 3. The element values of the real switched capacitor filter corresponding to the analog lowpass filter in FIG. 1 are obtained from the following general design equations for real switched capacitor filters:

$$C_{ii} = f_n(c_1 + c_j) + \frac{1}{4f_n l_j} - 0.5 \qquad i=1, j=2; i=n, j=n-1$$

$$C_{ii} = f_n l_i \qquad i = 2, 4, \ldots$$

$$C_{ii} = f_n(c_{i-1} + c_i + c_{i+1}) + \frac{1}{4f_n}\left(\frac{1}{l_{i-1}} + \frac{1}{l_{i+1}}\right) \qquad i = 3, 5, \ldots$$

$$C_{i-1,i+1} = C_{i+1,i-1} = f_n c_i + \frac{1}{4f_n l_i} \qquad i = 2, 4, \ldots$$

$$C_{01} = 1; T_{01} = 2$$

$$I_{ij} = 1 \qquad \forall i,j$$

$$B_{ij} = 1 \qquad \forall i,j$$

Here $f_n$ represents the normalized sampling frequency, which for lowpass filters may be calculated from:

$$f_n = \frac{1}{2\tan(\pi f_c / f_s)}$$

where $f_c$ is the desired cut-off frequency and $f_s$ is the sampling frequency of the real switched capacitor filter. In the present example (assuming $f_s = 20$) this leads to the following values:

$C_{01} = 1$      $B_{12} = 1$  $I_{21} = 1$  $T_{01} = 2$ $C_{11} = 3.381284$  $B_{11} = 1$  $I_{23} = 1$ $C_{22} = 3.423316$  $B_{33} = 1$ $C_{33} = 3.381284$  $B_{32} = 1$ $C_{13} = 0.284224$ $C_{31} = 0.284224$

These values represent an unscaled filter. To achieve an equal signal level for each amplifier output and a minimum unit capacitor value, the filter may be scaled. The corresponding scaled values are:

$C_{01} = 3.5184$   $B_{12} = 1.4411$  $I_{21} = 5.0703$  $T_{01} = 7.0367$ $C_{11} = 17.1441$  $B_{11} = 5.0703$  $I_{23} = 4.0132$ $C_{22} = 5.6272$   $B_{33} = 2.4414$ $C_{33} = 8.2551$   $B_{32} = 1$ $C_{13} = 1$ $C_{31} = 1$

Scaling of the real filter will imply that the corresponding complex filter will be scaled automatically. For this reason scaling is preferably performed on the real filter.

The final step in the design of the complex switched capacitor filter is to transform the real switched capacitor filter obtained from the analog baseband prototype filter into its complex extension. This may be done by extending the basic B, I, T and C elements into their complex counterparts. The number of operational amplifiers OP is also doubled.

The transformation to a complex filter may be performed by frequency shifting the variable z in the transfer functions of the basic elements, i.e.

$$z \to z_0 z$$

where $$z_0 = e^{-j\omega_0 \tau} = \cos(\omega_0 \tau) - j \sin(\omega_0 \tau) = \alpha - j\beta$$

and where $\omega_0$ represents the frequency shift and $\tau$ is the sampling period.

To illustrate the hardware modifications that are necessary for an extension of the basic elements into the complex domain, it is convenient to represent complex numbers in an equivalent matrix form according to:

$$x + jy \Leftrightarrow \begin{pmatrix} x & -y \\ y & x \end{pmatrix}$$

Figures 3, 4:
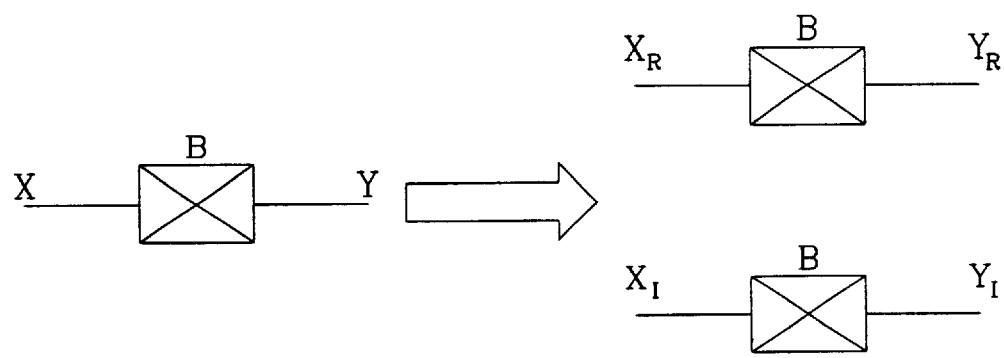
FIG. 3 is a table summarizing the different basic elements of the filter in FIG. 2.
FIG. 4 is block diagram illustrating the transformation of a real B element into a corresponding complex B element.

In this representation the non-inverting B element, which is represented by a transfer function that is a simple multiplication, may be extended as:

$$BX = Y \Rightarrow \begin{pmatrix} B & 0 \\ 0 & B \end{pmatrix}\begin{pmatrix} X_R \\ X_I \end{pmatrix} = \begin{pmatrix} Y_R \\ Y_I \end{pmatrix}$$

where $X_R$, $X_I$ represent the complex input signal to the element and $Y_R$, $Y_I$ represent the complex output signal from the element. FIG. 4 illustrates the corresponding hardware extension, which in this case simply amounts to the same multiplication by B for both the real and imaginary components.

For the remaining I, T and C elements the extension is more complicated, since their transfer functions contain the variable z. For the I element the following extension is obtained (remembering that $z_0 = \alpha - j\beta$):

$$-Iz^{-1}X = Y \Rightarrow \begin{pmatrix} -I\alpha z^{-1} & I\beta z^{-1} \\ -I\beta z^{-1} & -I\alpha z^{-1} \end{pmatrix}\begin{pmatrix} X_R \\ X_I \end{pmatrix} = \begin{pmatrix} Y_R \\ Y_I \end{pmatrix}$$

Figure 5:
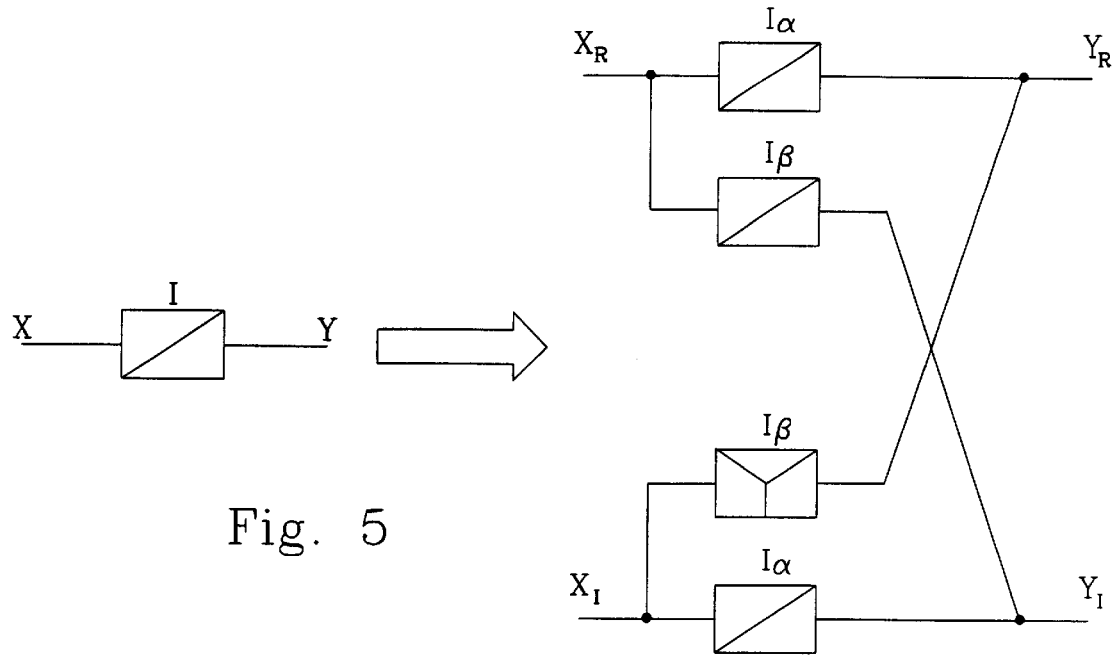
FIG. 5 is a block diagram illustrating the transformation of a real I element into a corresponding complex I element.

This transformation is illustrated in FIG. 5 for the case $\alpha, \beta > 0$. If $\alpha$ or $\beta$ or both are negative ($\omega_0 \tau > \pi/2$) the corresponding I elements are replaced by T elements and the corresponding T element is replaced by an I element. Similarly, for the T element the following extension is obtained:

$$Tz^{-1}X = Y \Rightarrow \begin{pmatrix} T\alpha z^{-1} & -T\beta z^{-1} \\ T\beta z^{-1} & T\alpha z^{-1} \end{pmatrix}\begin{pmatrix} X_R \\ X_I \end{pmatrix} = \begin{pmatrix} Y_R \\ Y_I \end{pmatrix}$$

Figure 6:
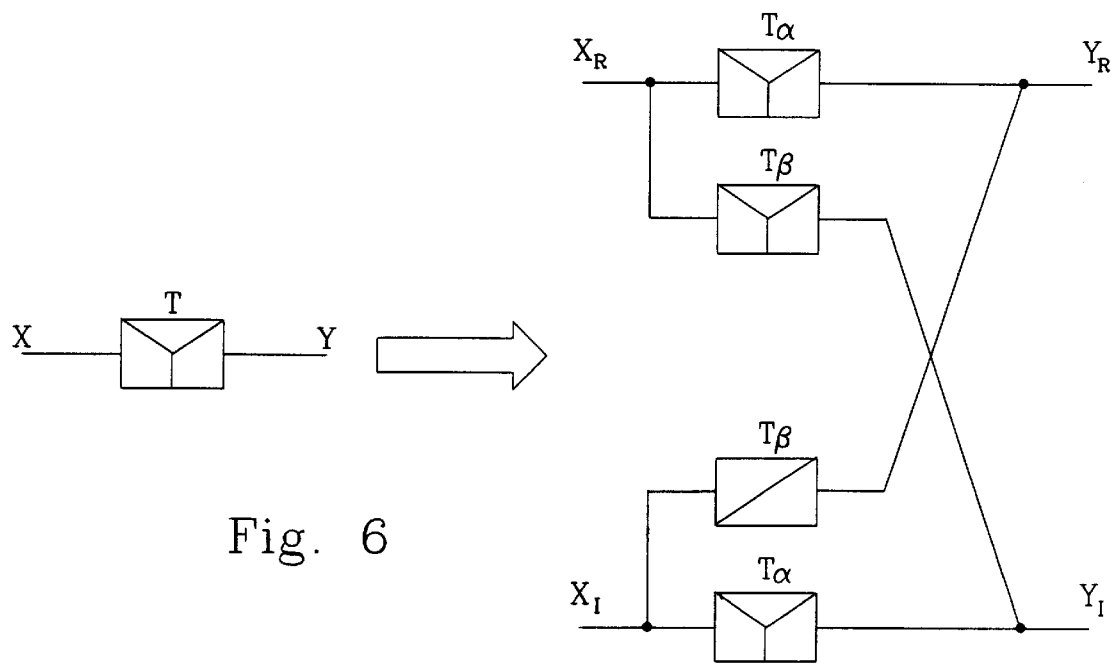
FIG. 6 is a block diagram illustrating the transformation of a real T element into a corresponding complex T element.

This transformation is illustrated in FIG. 6 for the case $\alpha, \beta > 0$. If $\alpha$ or $\beta$ or both are negative the corresponding T elements are replaced by I elements and the corresponding I element is replaced by a T element.

The transformation becomes more complicated for the C element. A straightforward extension to the complex domain gives:

$$C(1 - z^{-1})X = Y \Rightarrow \begin{pmatrix} C(1 - \alpha z^{-1}) & C\beta z^{-1} \\ -C\beta z^{-1} & C(1 - \alpha z^{-1}) \end{pmatrix}\begin{pmatrix} X_R \\ X_I \end{pmatrix} = \begin{pmatrix} Y_R \\ Y_I \end{pmatrix}$$

Figure 7:
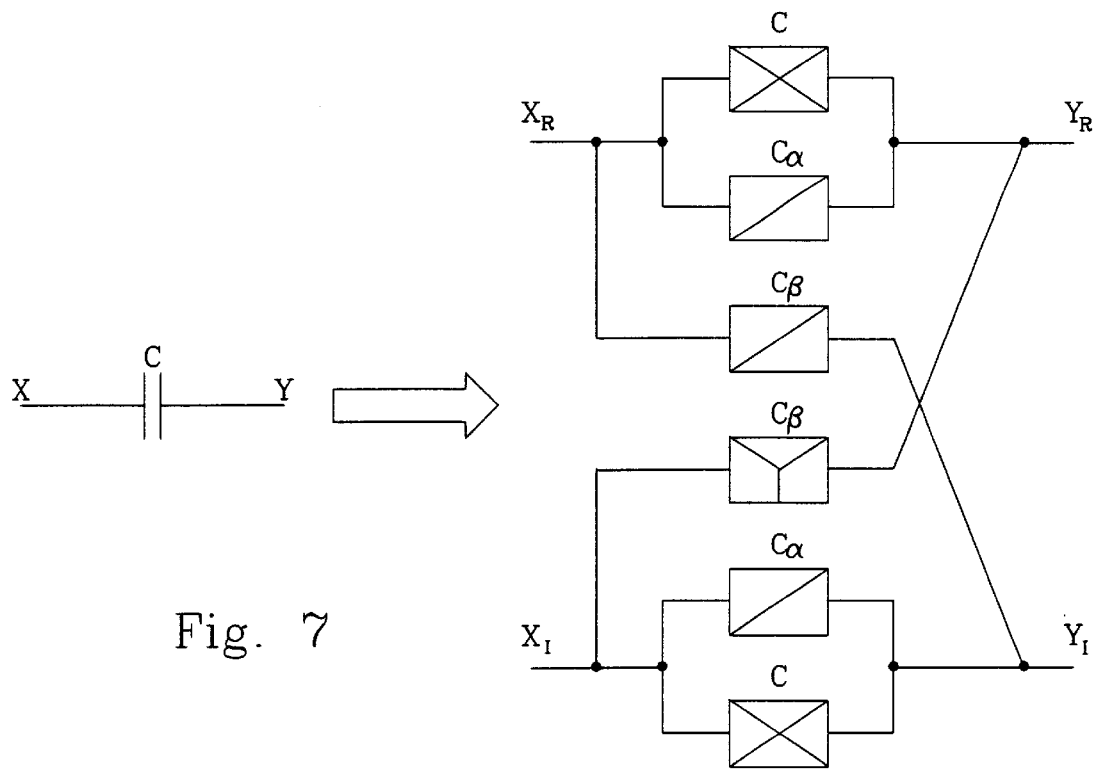
FIG. 7 is a block diagram illustrating the transformation of a real C element into a corresponding complex C element.

This transformation is illustrated in FIG. 7 for the case $\alpha, \beta > 0$. If $\alpha$ or $\beta$ or both are negative the corresponding I elements are replaced by T elements and the corresponding T element is replaced by an I element.

In the real switched capacitor filter of FIG. 2 there are two types of capacitors.

The first type is connected between an input of an operational amplifier OP and the output of another operational amplifier OP. A typical example is capacitor $C_{31}$. This type of capacitor is suitable for conversion in accordance with the straightforward rule above. Also a capacitor that is not connected to both an input and an output of an operational amplifier, like capacitor $C_{01}$ in FIG. 2 is of this type.

Another type of capacitor is a capacitor connecting the input and output of the same operational amplifier. This type of capacitor is represented by, for example, capacitor $C_{11}$ in FIG. 2. In this case a straightforward transformation is not preferred, since fixed capacitors are required. Noticing that the transformation matrix of the capacitor may be rewritten as:

$$\begin{pmatrix} C(1 - \alpha z^{-1}) & C\beta z^{-1} \\ -C\beta z^{-1} & C(1 - \alpha z^{-1}) \end{pmatrix} = \begin{pmatrix} C(1 - z^{-1}) & 0 \\ 0 & C(1 - z^{-1}) \end{pmatrix} + \begin{pmatrix} C(1 - \alpha)z^{-1} & C\beta z^{-1} \\ -C\beta z^{-1} & C(1 - \alpha)z^{-1} \end{pmatrix}$$

Figure 8:
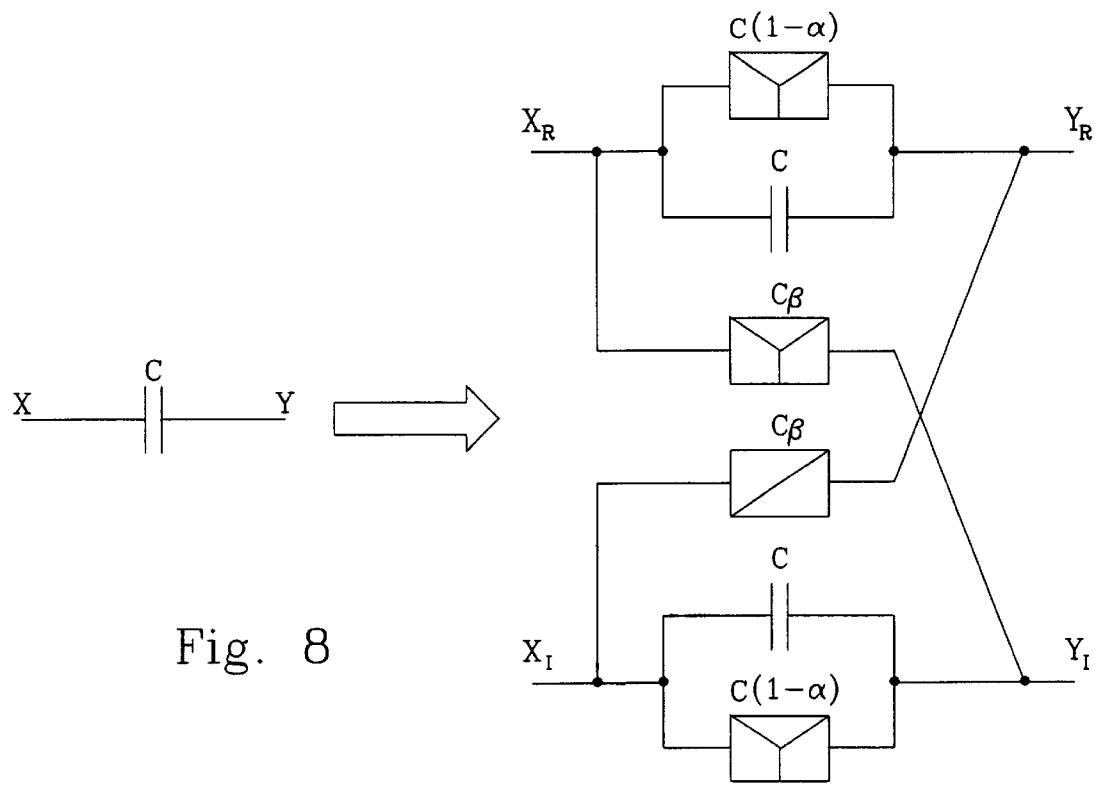
FIG. 8 is a block diagram illustrating another possible transformation of a real C element into a corresponding complex C element.

Thus, the converted capacitor may be viewed as two fixed capacitors and a combination of I and T elements, as illustrated in FIG. 8.

A disadvantage of the transformed capacitor illustrated in FIG. 8 is that it contains 3 T elements. Since these elements are parasitic sensitive they should preferably be avoided, if possible. If $\alpha>0$ the transformation matrix of the capacitor may instead be rewritten as:

$$\begin{pmatrix} C(1-\alpha z^{-1}) & C\beta z^{-1} \\ -C\beta z^{-1} & C(1-\alpha z^{-1}) \end{pmatrix} = \begin{pmatrix} C\alpha(1-z^{-1}) & 0 \\ 0 & C\alpha(1-z^{-1}) \end{pmatrix} + \begin{pmatrix} C(1-\alpha) & C\beta z^{-1} \\ -C\beta z^{-1} & C(1-\alpha) \end{pmatrix}$$

In such an embodiment the capacitor in FIG. 8 is replaced by a fixed capacitor having the value $C\alpha$, while the T elements $C(1-\alpha)$ are replaced by B elements with the same value. In this way only one T element with the value $C\beta$ remains.

Figure 9:
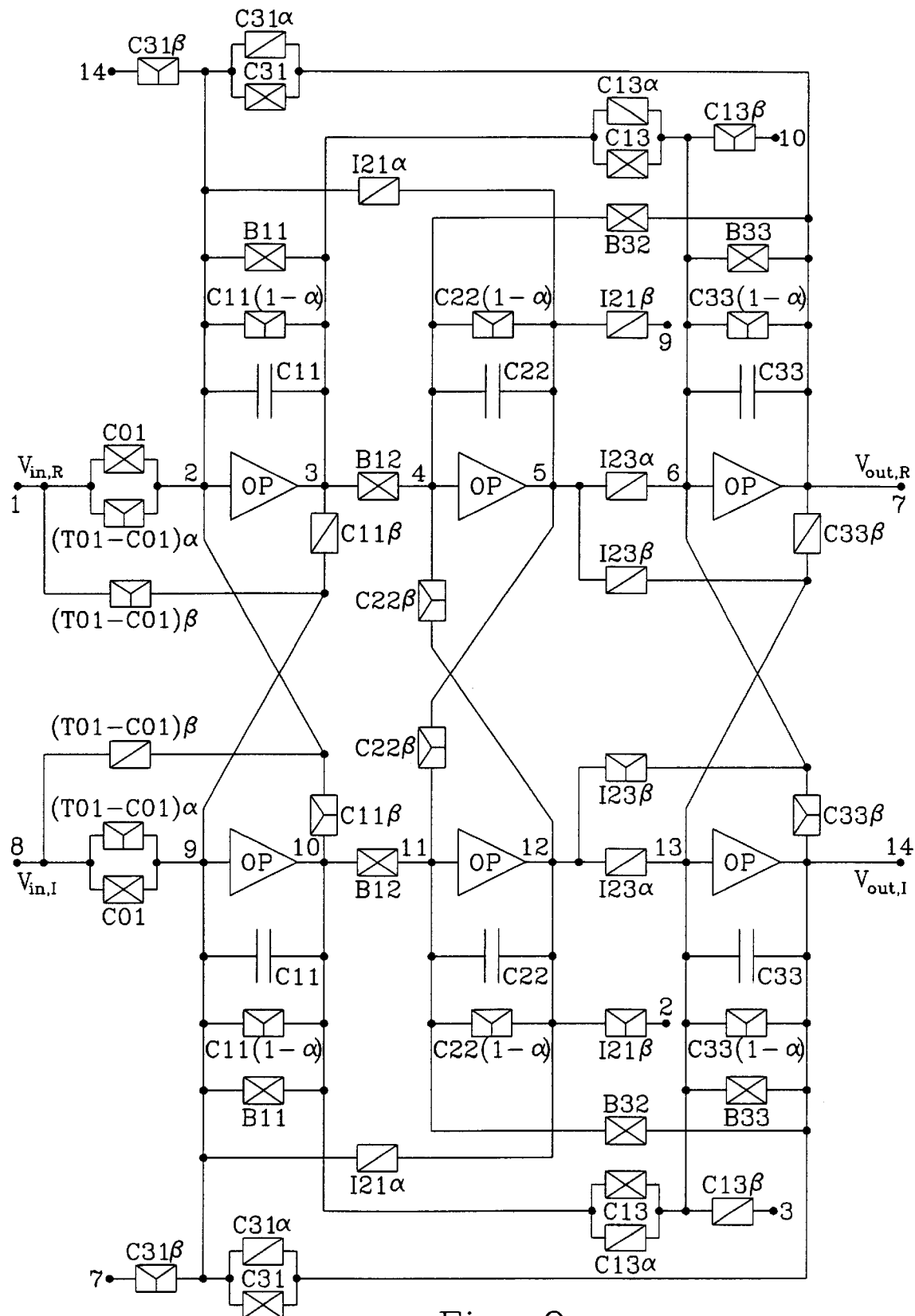
FIG. 9 is a block diagram of a complex switched capacitor bandpass filter corresponding to the real filter of FIG. 2.
Figure 10:
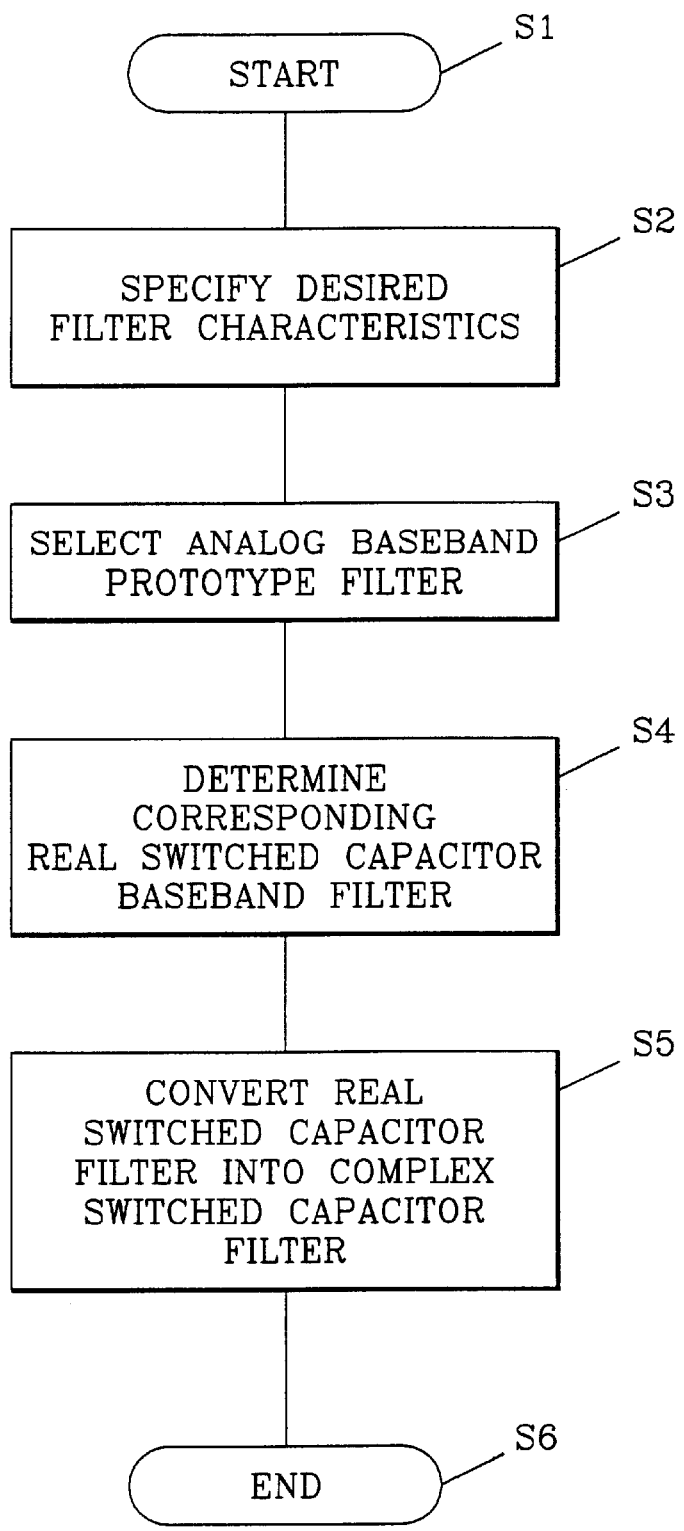
FIG. 10 is a flow chart illustrating the filter transformation process in accordance with the present invention.

FIG. 9 illustrates a complex switched capacitor bandpass filter obtained by transforming the basic B, I, T and C elements of the switched capacitor lowpass filter of FIG. 2 in accordance with the principles described above. In this embodiment it is assumed that $\alpha,\beta>0$. Furthermore, the numbered connection points 2–7 and 9–14 are assumed to be connected in pairs 2–2, 3–3, etc. This assumption facilitates the drawing FIG. 10 is a flow chart illustrating the transformation method in accordance with the present invention. After starting the process in step S1, the desired filter characteristics, such as stop band attenuation, cut-off frequency, etc, are specified in step S2. In step S3 an analog baseband prototype filter fulfilling these specifications is selected, for example form a filter table. Step S4 converts this prototype filter into a corresponding real switched capacitor baseband filter having the same specifications. In step S5 this filter is converted into a corresponding complex switched capacitor filter by frequency shifting its basic B, I, T and C elements into corresponding complex elements. The resulting filter will have the same specifications as the real switched capacitor filter, but the filter will be around the shift frequency instead of at the baseband. This ends the process in step S6. As mentioned above the real switched capacitor filter may optionally be scaled before the final frequency shift.

In the above description it has been assumed that a real switched capacitor filter has been obtained from an analog prototype filter. However, it is also conceivable to design the real switched capacitor filter directly and convert this filter into a complex filter.

It will be understood by those skilled in the art that various modifications and changes may be made to the present invention without departure from the spirit and scope thereof, which is defined by the appended claims.

CITATIONS

[1] S. Signell, "Design of Parasitics-Insensitive Bilinear Switched-Capacitor Filters—A matrix Conversion Method", Report No TRITA-TTT-8108, Telecomm. Theory, Royal Institute of Technology, Stockholm, Dec. 1981

[2] Antol I Zzerev, "Handbook of Filter Synthesis"

What is claimed is:

1. A method of forming a complex switched capacitor bandpass filter with predefined filter characteristics, comprising the steps of:

selecting an analog lowpass prototype filter matching the predefined filter characteristics;

performing a bilinear transformation to convert the analog lowpass prototype filter into a corresponding real switched capacitor lowpass filter; and frequency shifting the real switched capacitor lowpass filter into a complex switched capacitor bandpass filter.

2. The method of claim 1, further comprising scaling the real switched capacitor lowpass filter.

3. The method of claim 1, further comprising frequency shifting the real switched capacitor lowpass filter by replacing each element of the real switched capacitor by a frequency shifted counterpart.

4. The method of claim 1, wherein the step of performing a bilinear transformation to convert the analog lowpass prototype filter into a corresponding real switched capacitor lowpass filter is performed at baseband.

5. The method of claim 1, wherein the step of converting the analog lowpass prototype filter into a corresponding real switched capacitor lowpass filter with a bilinear transformation further comprises the steps of:

performing a frequency shift to baseband, so that the center frequency is shifted to origin.

* * * * *